United States Patent
Choi

(10) Patent No.: US 6,956,440 B2
(45) Date of Patent: Oct. 18, 2005

(54) PLL HAVING A CONTROLLER FOR DIVIDING VALUES OF A VCO

(75) Inventor: Yun Young Choi, Chungcheongbuk-do (KR)

(73) Assignee: Hynix Semiconductor Inc., Kyungki-Do (KR)

(*) Notice: Subject to any disclaimer, the term of this patent is extended or adjusted under 35 U.S.C. 154(b) by 111 days.

(21) Appl. No.: 10/603,383

(22) Filed: Jun. 25, 2003

(65) Prior Publication Data

US 2004/0085139 A1 May 6, 2004

(30) Foreign Application Priority Data

Nov. 4, 2002 (KR) .................... 10-2002-0067861

(51) Int. Cl.$^7$ ............................................. H03L 7/00
(52) U.S. Cl. ..................... 331/1 A; 331/17; 327/156
(58) Field of Search ..................... 331/1 A, 17, 18, 331/25; 327/156, 158, 159, 160

(56) References Cited

U.S. PATENT DOCUMENTS

| | | | |
|---|---|---|---|
| 4,394,776 A | | 7/1983 | Borras et al. |
| 4,472,820 A | | 9/1984 | Borras |
| 5,045,813 A | * | 9/1991 | Yamashita et al. ............ 331/16 |
| 5,701,598 A | | 12/1997 | Atkinson |
| 6,031,425 A | * | 2/2000 | Hasegawa ................... 331/1 A |
| 6,094,100 A | * | 7/2000 | Kamikubo et al. ......... 331/1 A |
| 6,137,372 A | | 10/2000 | Welland |
| 6,233,441 B1 | | 5/2001 | Welland |
| 6,304,146 B1 | | 10/2001 | Welland |
| 6,327,463 B1 | | 12/2001 | Welland |
| 6,329,855 B1 | | 12/2001 | Horie |
| 6,424,192 B1 | | 7/2002 | Lee et al. |

FOREIGN PATENT DOCUMENTS

| | | |
|---|---|---|
| JP | 3135112 | 6/1991 |
| JP | 3139018 | 6/1991 |
| JP | 6104750 | 4/1994 |
| KR | 96-009972 | 7/1996 |
| KR | 2002-0028418 | 4/2002 |

OTHER PUBLICATIONS

"Notice of Rejection," Issued by Korean Intellectual Property Office, dated Oct. 12, 2004.

* cited by examiner

Primary Examiner—Robert Pascal
Assistant Examiner—Joseph Chang
(74) Attorney, Agent, or Firm—Marshall, Gerstein & Borun LLP

(57) ABSTRACT

A PLL can operate linearly at various frequencies by overlapping several VCOs and using a control circuit for controlling the several VCOs to select a VCO at a desired frequency. Accordingly, the PLL can automatically precompensate the frequency by using a control signal used in the PLL. As a result, a separate frequency compensation signal is not required. The PLL can be configure on a single chip when the VCO is contained within the PLL.

5 Claims, 6 Drawing Sheets

PLL HAVING A CONTROLLER FOR DIVIDING VALUES OF A VCO

BACKGROUND

1. Technical Field

The present disclosure relates generally to phase locked loops (hereinafter, referred to as 'PLL'), and more specifically, to a PLL having a controller for dividing values of a voltage controlled oscillator (hereinafter, referred to as 'VCO') in all frequency bandwidths.

2. Background

FIG. 1 is a block diagram illustrating a conventional PLL having a program counter.

The PLL comprises a phase comparator 1, a low pass filter LPF 2, a VCO 3 and a program counter 4. The phase comparator 1 compares a reference frequency fr of an external clock signal ECLK with a comparison frequency fp of a comparison clock signal PCLK. The low pass filter LPF 2 filters an output signal from the phase comparator 1. The VOC 3 generates a signal of frequency varying proportional to the DC signal from the low pass filter 2. The program counter 4 divides a frequency of an output clock signal ICLK from the VCO 3 at a predetermined 1/N division ratio.

An output frequency fvco of the output clock signal ICLK from the VCO 3 is divided into 1/N by the program counter 4. The divided frequency negatively feeds back as the comparison frequency fp, and then it is inputted into the phase comparator 1.

Here, the output frequency fvco from the voltage control oscillator 3 is defined by the following equation 1:

$$fp = \frac{fvco}{N} \qquad \text{Equation 1}$$

Here, fp=fr, and [Equation 1] can be represented by the following equation 2:

$$fvco = N \times fr \qquad \text{Equation 2}$$

Equation 2 shows that if the value of N varies, the output frequency fvco can be changed by the step of the reference frequency fr.

Accordingly, if the output frequency fvco is used in local oscillators of various telecommunication apparatus, one crystal oscillator can use various frequencies with the high stability. However, if the output frequency fvco becomes larger, it is difficult for the program counter 4 to divide the larger output frequency fvco.

Accordingly, a PLL uses a prescaler which can operate at a high speed, as shown in FIG. 2.

FIG. 2 is a block diagram illustrating a conventional PLL having a prescaler.

The PLL comprises a phase comparator 11, a low pass filter 12, a VCO 13, a prescaler 14 and a program counter 15. The phase comparator 11 compares a reference frequency fr of an external clock signal ECLK with a comparison frequency fp of a comparison clock signal PCLK. The low pass filter 12 filters an output signal from the phase comparator 11. The VCO 13 generates a signal of frequency proportional to a DC signal of the low pass filter 12. The prescaler 14 divides an output signal from the VCO 13 into 1/M. The program counter 15 divides a clock signal divided by the prescaler 14 into 1/N.

The output frequency fvco from the VCO 13 is divided into 1/M by the prescaler 14. And the divided output frequency fvco is divided into 1/N by the program counter 15 again. The divided frequency negatively feeds back as the comparison frequency fp, and it is inputted into the phase comparator 11.

Here, the comparison frequency fp is defined by the following equation 3:

$$fp = \frac{fvco}{N \times M} \qquad \text{Equation 3}$$

Accordingly, the output frequency fvco is defined by the following equation 4. Here, fp=fr.

$$fvco = N \times M \times fr \qquad \text{Equation 4}$$

In Equation 4, if the division ratio N of the program counter 15 varies, the output frequency fvco is changed into a step of M×fr. As a result, M×fr is a channel separation, which is a frequency interval of channel. And the reference frequency fr in a synthesizer is division ratio 1/M of the channel separation.

FIG. 3 is a block diagram illustrating a conventional PLL having a swallow counter setting a channel separation as the reference frequency fr.

The PLL comprises a phase comparator 21, a low pass filter 22, a VCO 23, a dual modulus prescaler 24, a program counter 25, a swallow counter 26 and a controller 27. The phase comparator 21 compares the reference frequency fr with the comparison frequency fp. The VCO 23 generates a signal of frequency proportional to a DC signal from the low pass filter 22. The dual modulus prescaler 24 divides a frequency of an output clock signal ICLK from the VCO 23 into 1/M and 1/(M+1). The program counter 25 divides a clock signal divided by the prescaler 24 into 1/N. The swallow counter 26 divides a clock signal divided by the prescaler 24 into 1/A. The controller 27 outputs a mode control signal MC for controlling the prescaler 24 by using output signals from the swallow counter 26 and the program counter 25.

The output frequency fvco of the output clock signal ICLK from the VCO 23 is divided by the dual modulus prescaler 24 having division ratios 1/M and 1/(M+1), and then the divided frequency is inputted into the program counter 25 and the swallow counter 26.

The swallow counter 26 is used for selecting division ratios of the prescaler 24.

The prescaler 24 is set at a division ratio 1/(M+1) until the swallow counter 26 counts A pulses.

After the swallow counter 26 counts A pulses, the prescaler 24 is set at a division ratio 1/M. The time of A/N is a division ratio of 1/[(M+1)×N], and the time of (N−A)/N is a division ratio of 1/M×N.

Here, the comparison frequency fp is defined by the following equation 5:

$$fp = \frac{fvco}{\left\{\left((M+1) \times N\right) \times \frac{A}{N} + \left((M \times N) \times \frac{(N-A)}{N}\right)\right\}} \qquad \text{Equation 5}$$

$$= \frac{fvco}{\{((M+1) \times A) + ((N-A) \times M)\}}$$

Accordingly, the output frequency fvco is defined by the following equation 6:

$$fvco = fp\{((M+1) \times A) + ((N-A) \times M)\} \quad \text{Equation 6}$$
$$= fp(A + M \times N)$$
$$= fr(A + M \times N)$$

In Equation 6, N is the coefficient of M, but it is not the coefficient of A. As a result, if the value of A varies, the reference frequency fr is changed. In this way, if the prescaler 24 is used in the PLL, the channel separation can be the reference frequency fr. Particularly, a pulse swallow is used because the prescaler 24 can be set at a high division ratio in a high-frequency synthesizer.

Generally, the output frequency fvco is defined by the following equation 7:

$$fvco = \{(M \times N) + A\} \times \frac{fosc}{R} \quad \text{Equation 7}$$

Here, M is the division ratio of the prescaler 24, and N is the set point of the program counter 25. A is the set point of the swallow counter 26, having a relation of A<N. In Equation 7, fosc represents the reference oscillating frequency, and R represents the set point of the reference counter.

However, the VCO of the above-described conventional PLLs cannot be used in various frequency bandwidths due to its non-linear characteristic.

SUMMARY OF THE DISCLOSURE

In accordance with the present disclosure, a VCO may operate linearly at various frequencies by overlapping several VCOs and using a control circuit for selecting one VCO operating at a desired frequency.

A PLL includes a phase comparator, a filter, a VCO, a prescaler, a program counter, swallow counter, a controller, and a control signal generator.

The phase comparator compares a reference frequency of an external clock signal with a comparison frequency of a comparison clock signal. The filter filters an output signal from the phase comparator. The VCO generates clock signal having a frequency proportional to a DC signal from the filter. The prescaler selectively divides the output clock signal from the VCO by using at least two division ratios. The program counter divides an output signal from the prescaler by a division ratio to output the comparison clock signal having the comparison frequency. The swallow counter selects the division ratio of the prescaler. The controller controls the prescaler by using output signals from the program counter and the swallow counter. The control signal generator outputs a control signal to control frequency division of the VCO by using set points of the prescaler, the swallow counter and the program counter.

BRIEF DESCRIPTION OF THE DRAWINGS

The disclosure will be described in terms of several embodiments to illustrate its broad teachings. Reference is also made to the attached drawings.

DETAILED DESCRIPTION

The present disclosure will be described in detail with reference to the accompanying drawings.

Figure 1:
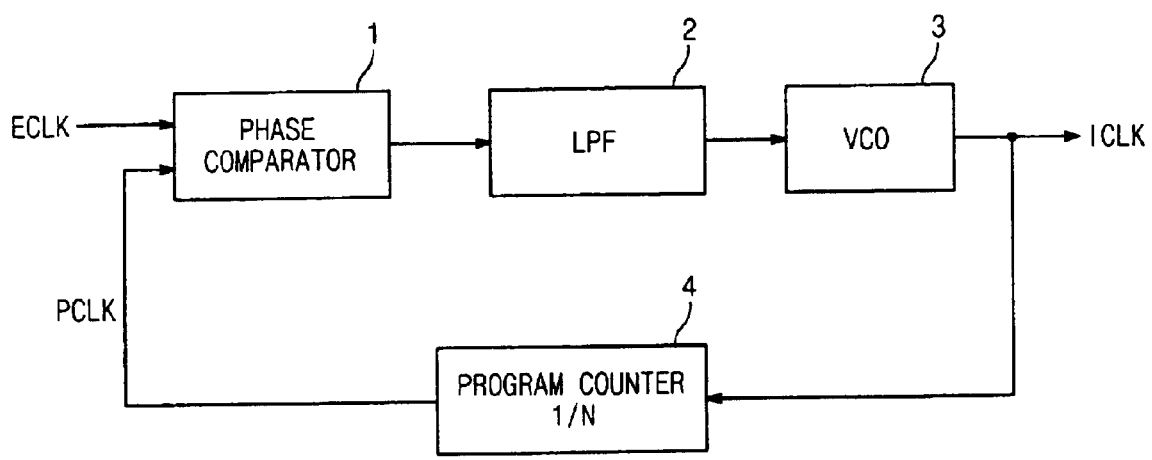
FIG. 1 is a block diagram illustrating a conventional PLL having a program counter.
Figure 2:
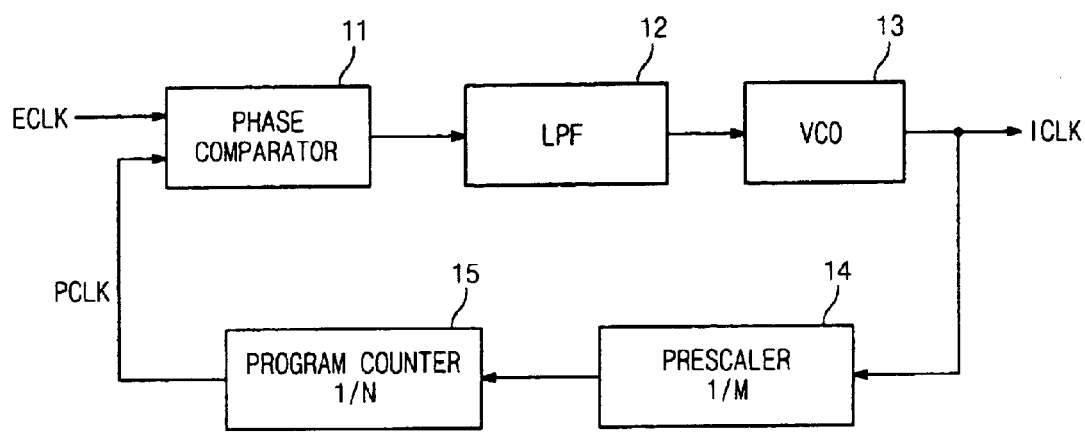
FIG. 2 is a block diagram illustrating a conventional PLL having a prescaler.
Figure 3:
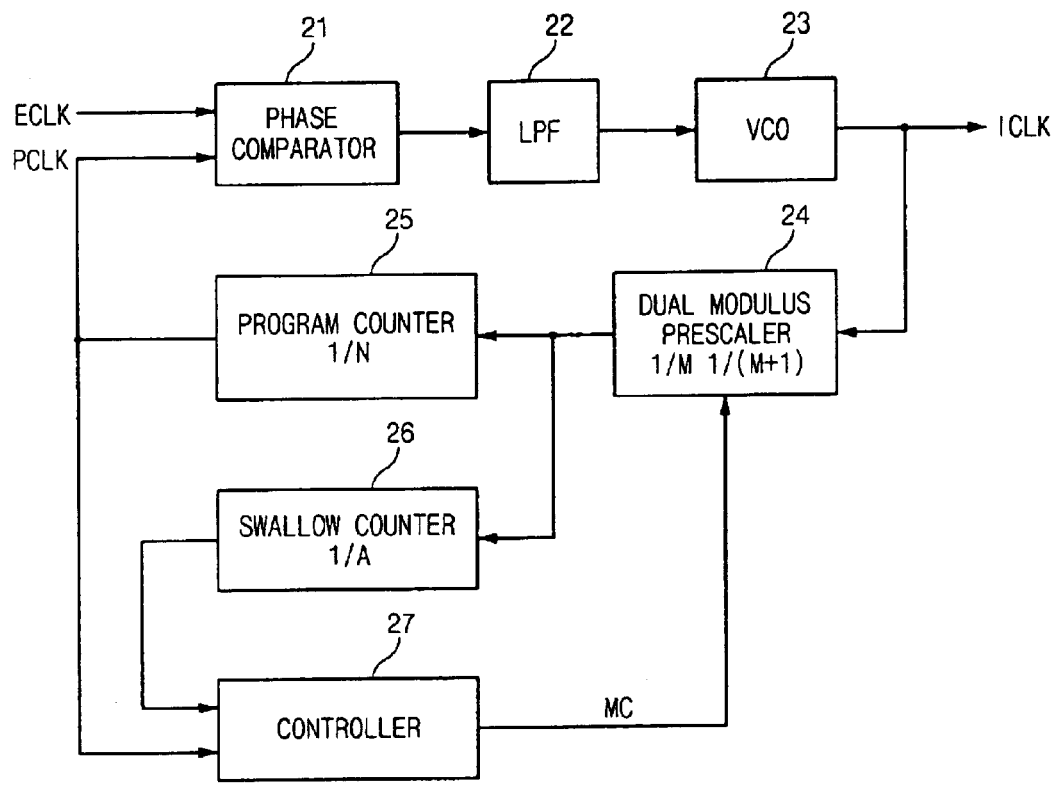
FIG. 3 is a block diagram illustrating a conventional PLL having a swallow counter.
Figure 4:
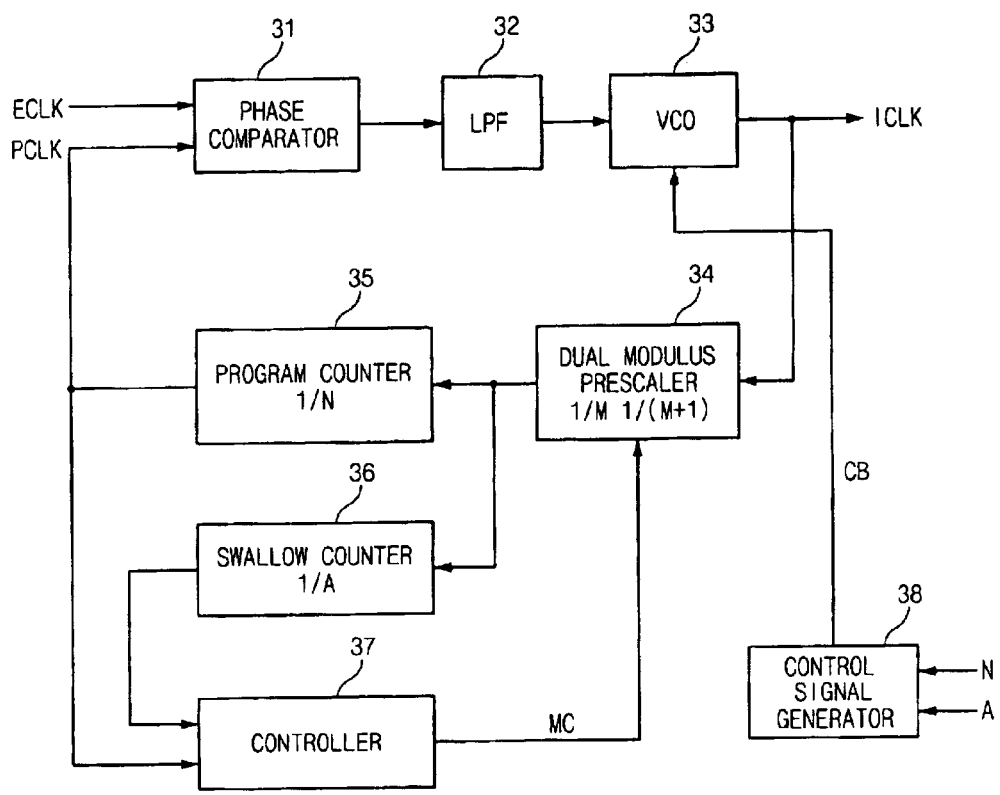
FIG. 4 is a block diagram illustrating a PLL having a swallow counter according to the present disclosure.

FIG. 4 is a block diagram illustrating a PLL having a swallow counter according to the present disclosure.

A PLL in accordance with the present disclosure includes a phase comparator 31, a low pas filter 32, a VCO 33, a dual modulus prescaler 34, a program counter 35, a swallow counter 36, a controller 37 and a control bit generator 38. The phase comparator 31 compares a reference frequency fr of an external clock signal ECLK with a comparison frequency fp of a comparison clock signal PCLK. The VCO 33 generates an internal clock signal Iclk having a frequency proportional to a DC signal from the low pass filter 32. The dual modulus prescaler 34 divides an internal clock signal ICLK by division ratios 1/M and 1/(M+1). The program counter 35 divides an output clock signal from the prescaler 34 by a division ratio 1/N. The swallow counter 36 divides an output clock signal from the prescaler 34 by a division ratio 1/A. The controller 37 controls the prescaler 34 by using output signals from the program counter 35 and the swallow counter 36. The control bit generator 38 generates a control bit CB for controlling the VCO 33.

An output frequency fvco from an internal clock signal ICLK of the VCO 33 is divided by the dual modulus prescaler 34 having division ratios 1/M and 1/(M+1). The divided frequency is inputted into the program counter 35 and the swallow counter 36.

The swallow counter 36 is used for selecting one of the division ratios of the prescaler 34. The prescaler is set at a division ratio 1/(M+1) until the swallow counter 36 counts A pulses.

After the swallow counter 36 counts A pulses, the prescaler 35 is set at a division ratio 1/M.

Accordingly, the whole division value Ntotal is defined by the following equation 8:

$$N\text{total} = M \times N + A \quad \text{Equation 8}$$

When the frequency division VCO 33 is used, values of N and A are used as control input values. In other words, if the control bit generator 38 uses the values of N and A as control input values, the frequency division VCO 33 can be controlled. The control bit generator 38 generates the control bit CB for controlling the frequency division VCO 33 by using the set point A of the swallow counter 36, the set point N of the program counter 35, and the set point M of the prescaler 34. However, since the control bit CB becomes larger and the circuit of the control bit generator 38 becomes complicated, the control bit generator 38 for generating the control bit CB is explained herein by using the set point N of the program counter 35 and the set point A of the swallow counter 36.

The VCO 33 receives input values N and A from the program counter 35 and the swallow counter 36 to operate at a predetermined frequency, and uses the input values N and A as control values.

Accordingly, a method should be considered to satisfy the whole range of frequency in a given variable voltage area and to reduce the value of actual oscillating frequency size Kvco by using an oscillating frequency division method.

Figure 5:
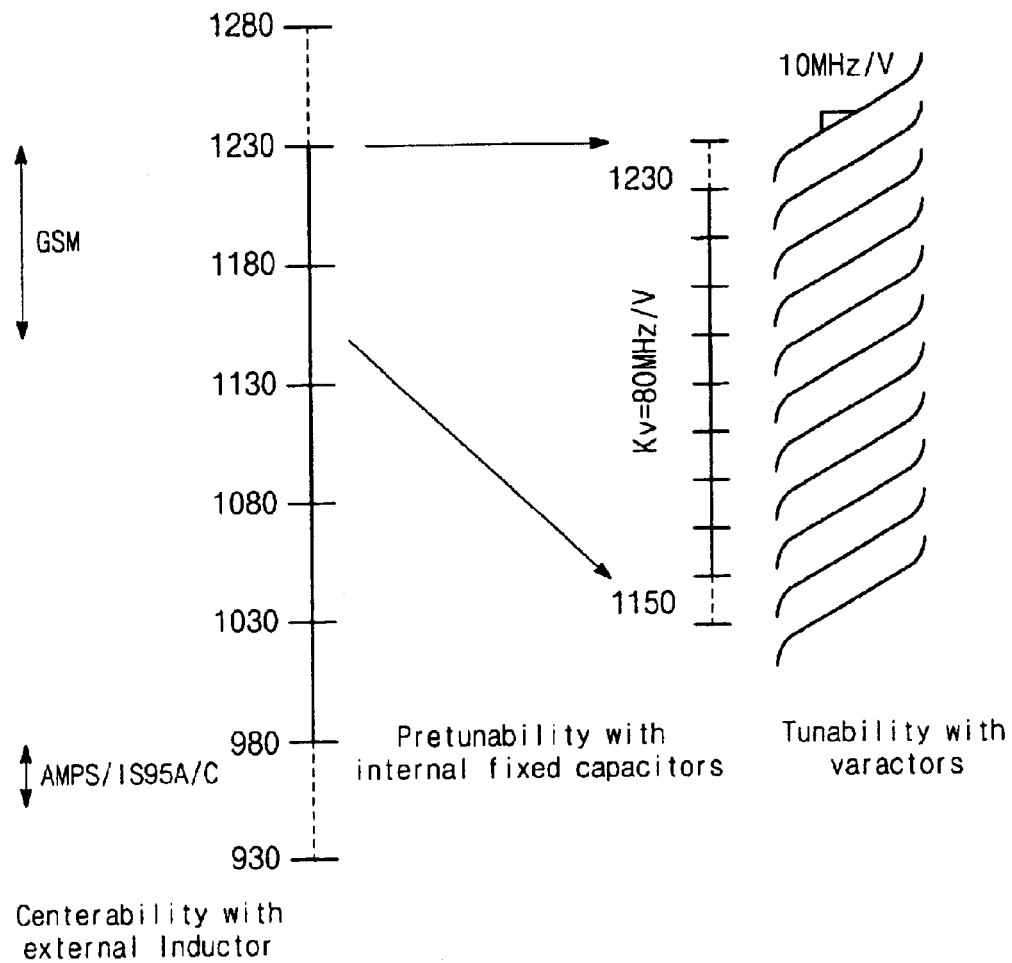
FIG. 5 is a graph illustrating an example of the frequency range of a RF2 VCO and the division of regions.

FIG. 5 is a graph illustrating an example of the frequency range of an RF2 VCO and the division of regions.

Referring to FIG. 5, if the range of variable voltage is 1V in the frequency range of GSM from 1150 MHz to 1230 MHz, the oscillating frequency Kvco has the value of 80 MHz/V.

However, if the frequency range is fixed at 10 MHz and a partial area of each frequency is selected, the whole frequency range can be satisfied. The size of each oscillating frequency Kvco can be 10 MHz/V.

In the disclosed PLL, the frequency division VCO 33 is used to have good characteristics and use broad frequency. When the output frequency of the frequency division VCO 33 reaches its corresponding frequency area nearby, the disclosed PLL selects a corresponding section.

If a voltage profit of the VCO 33 is determined, for example, as 10 MHz/V, the number of the VCO 33 is determined, and then the output control bit CB from the control bit generator 38 is determined.

As a result, the output control bit CB is determined as 5 bit. In order to control the VCO 33 of its corresponding frequency, a look up table is made by calculating the whole division value Ntotal corresponding to the frequency and input values A and N corresponding to the whole division value Ntotal. Accordingly, the control bit generator 38 is designed, based on the table.

For example, in order to design the control bit generator 38 which operates in 1.24968 GHz by using Equation 8, the whole division value Ntotal is first determined as 127. Then, the division value N of the program counter 35 is determined as 15, and the division value A of the swallow counter 36 as 7. As a result, the output control bit CB can be determined.

Here, the division ratio M of the prescaler 34 is determined as 8, the reference oscillating frequency fosc as 19.68 MHz, and the set point of the reference counter R as 2.

Accordingly, the look-up table to design the disclosed control bit generator 38 is represented by the following Table 1.

TABLE 1

| Standards | Fref | Ntotal | A | N | A(bin) | N(bin) | Control bit(CB) |
|---|---|---|---|---|---|---|---|
| GSM | 13 | 88 | 0 | 11 | 0000 | 01011 | 00110 |
|  |  | 89 | 1 | 11 | 0001 | 01011 | 00101 |
|  |  | 90 | 2 | 11 | 0010 | 01011 | 00100 |
|  |  | 91 | 3 | 11 | 0011 | 01011 | 00011 |
|  |  | 92 | 4 | 11 | 0100 | 01011 | 00010 |
|  |  | 93 | 5 | 11 | 0101 | 01011 | 00001 |
|  |  | 94 | 6 | 11 | 0110 | 01011 | 00000 |
| AMPS/IS-95 A/C | 9.84 | 96 | 0 | 12 | 0000 | 01100 | 11001 |
|  |  | 97 | 1 | 12 | 0001 | 01100 | 11000 |
|  |  | 98 | 2 | 12 | 0010 | 01100 | 10000 |
|  |  | 99 | 3 | 12 | 0011 | 01100 | 1000 |

Figure 6:
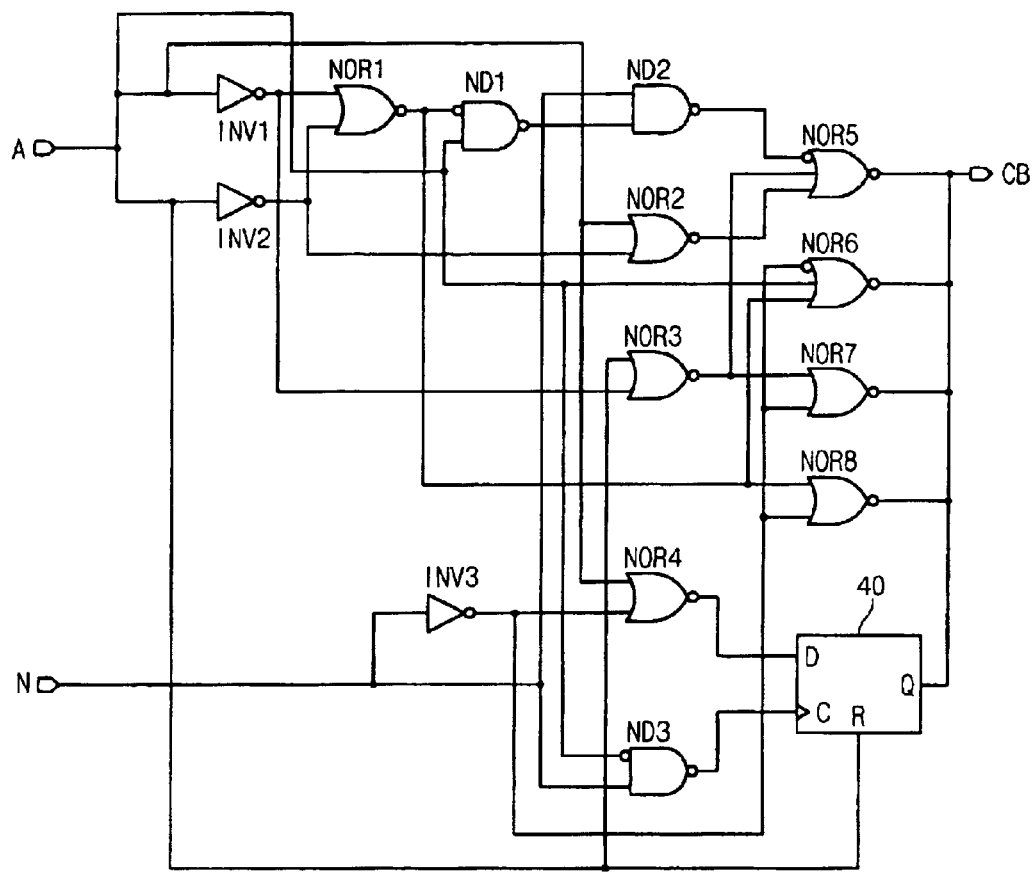
FIG. 6 is a circuit diagram illustrating a control bit generator of the VCO according to the present disclosure.

FIG. 6 is a circuit diagram illustrating a control bit generator 38 of the VCO 33 according to the present disclosure.

The control bit generator 38 includes: inverters INV1, INV2 and INV3; NOR gates NOR1, NOR2, NOR3, NOR4, NOR5, NOR6, NOR7 and NOR8; NAND gates ND1, ND2 and ND3; and a D flip-flop 40. The inverters INV1 and INV2 invert the division value A of the swallow counter 36. The inverter INV3 inverts the division value N of the program counter 34. The NOR gate NOR1 NORs output signals from the inverters INV1 and INV2. The NAND gate ND1 NANDs an inverted output signal from NOR gate NOR1 and the division value A of the swallow counter 36. The NOR gate NOR2 NORs the division value A of the swallow counter 36 and an output signal from the inverter INV2. The NOR gate NOR3 NORs the division value A of the swallow counter 36 and an output signal from the inverter INV1. The NOR gate NOR4 NORs the division value A of the swallow counter 36 and an output signal from the inverter INV3. The NAND gate ND3 NANDs an inverted signal of the division value A of the swallow counter 36 and the division value of the program counter 34. The NOR gate NOR5 NORs an inverted output signal of the NAND gate ND2 and output signals from the NOR gates NOR2 and NOR3. The NOR gate NOR6 NORs an inverted output signal of the inverter INV3, the division value A of the swallow counter 36 and an output signal from the NOR gate NOR1. The NOR gate NOR7 NORs output signals from the OR gate NOR3 and the inverter INV3. The NOR gate NOR8 NORs output signals from the NOR gate NOR1 and the inverter INV3. The D flip-flop 40 includes a reset input terminal R to receive the division value A of the swallow counter 36, a clock input terminal C to receive the output signal from the NAND gate ND3, and a data input terminal D to receive the output signal from the NOR gate NOR4. The control bit CB is generated by the NOR gates NOR5, NOR6, NOR7, NOR8 and the D flip-flop 40.

Most PLLs in the current market include VCOs and filters installed outside. These external components have a great effect on cost and yield of products. Accordingly, since frequencies are pre-compensated automatically, the PLL can be simplified and compensated precisely.

As discussed above, in the disclosed PLL including the prescaler, frequencies can be pre-compensated automatically by using the control signal used in the PLL. As a result, a separate frequency compensation signal is not required. Additionally, when the VCO is built within the entire PLL, the PLL circuit can be embodied on a single chip.

While the disclosure is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A phase locked loop circuit comprising:

a phase comparator for comparing a reference frequency of an external clock signal with a comparison frequency of a comparison clock signal;

a filter for filtering an output signal from the phase comparator;

a voltage controlled oscillator for generating a clock signal having a frequency proportional to a DC signal from the filter;

a prescaler for dividing an output clock signal from the voltage controlled oscillator by using at least two division ratios;

a program counter for dividing an output signal from the prescaler by a division ratio and outputting the comparison clock signal having the comparison frequency;

a swallow counter for controlling the division ratio of the prescaler;

a controller for controlling the prescaler by using output signals from the program counter and the swallow counter; and a control signal generator for outputting a control signal to control frequency division of the voltage controlled oscillator by using set points of the prescaler, the swallow counter, and the program counter.

2. The phase locked loop circuit according to claim 1, wherein the prescaler is set at a larger one of the at least two division ratios while the swallow counter operates.

3. The phase locked loop circuit according to claim 1, wherein the prescaler is set at a smaller one of the at least two division ratios after the swallow counter counts a number of pulses corresponding to the set point of the swallow counter.

4. The phase locked loop circuit according to claim 1, wherein the control signal generator is configured using a bit number of the control signal, the whole counter set point, the swallow counter set point and the program counter set point.

5. The phase locked loop circuit according to claim 4, wherein the bit number of the control signal is determined by determining a voltage profit of the voltage controlled oscillator when the set point of the prescaler is set, wherein the whole counter set point of corresponding frequency is determined, and wherein the swallow counter set point and the program counter set point corresponding to the whole counter set point are determined.

* * * * *

UNITED STATES PATENT AND TRADEMARK OFFICE
CERTIFICATE OF CORRECTION

| | | |
|---|---|---|
| PATENT NO. | : 6,956,440 B2 | Page 1 of 1 |
| APPLICATION NO. | : 10/603383 | |
| DATED | : October 18, 2005 | |
| INVENTOR(S) | : Yun Y. Choi | |

It is certified that error appears in the above-identified patent and that said Letters Patent is hereby corrected as shown below:

In the Abstract:

At the cover page, (57) Column 2, please replace the abstract to read as follows:

--A PLL can operate linearly at various frequencies by overlapping several VCOs and using a control circuit for controlling the several VCOs to select a VCO at a desired frequency. Accordingly, the PLL can automatically pre-compensate the frequency by using a control signal used in the PLL. As a result, a separate frequency compensation signal is not required. The PLL can be configured on a single chip when the VCO is contained within the PLL.--

Signed and Sealed this

Twenty-third Day of January, 2007

JON W. DUDAS
*Director of the United States Patent and Trademark Office*